(12) United States Patent
Yoo

(10) Patent No.: US 6,476,402 B1
(45) Date of Patent: Nov. 5, 2002

(54) APPARATUS FOR PYROELECTRIC EMISSION LITHOGRAPHY USING PATTERNED EMITTER

(75) Inventor: In-Kyeong Yoo, Yongin (KR)

(73) Assignees: Samsung Electronics Co., Ltd., Kyungki-do (KR); Virginia Tech Intellectual Properties, Inc., Blacksburg, VA (US)

( * ) Notice: Subject to any disclaimer, the term of this patent is extended or adjusted under 35 U.S.C. 154(b) by 128 days.

(21) Appl. No.: 09/619,526

(22) Filed: Jul. 19, 2000

(51) Int. Cl.[7] ................................................ H01J 37/00

(52) U.S. Cl. ................................ 250/492.24; 250/492.2

(58) Field of Search ..................... 257/492.24, 492.2; 430/30, 296

(56) References Cited

U.S. PATENT DOCUMENTS 5,729,583 A * 3/1998 Tang et al. .................. 378/122

* cited by examiner

Primary Examiner—Kiet T. Nguyen
(74) Attorney, Agent, or Firm—Lee & Sterba, P.C.

(57) ABSTRACT

A method and an apparatus for pyroelectric lithography using a patterned emitter is provided. In the apparatus for pyroelectric lithography, a pyroelectric emitter or a ferroelectric emitter is patterned using a mask and it is then heated. Upon heating, electrons are not emitted from that part of the emitter covered by the mask, but are emitted from the exposed part of the emitter not covered by the mask so that the shape of the emitter pattern is projected onto the substrate. To prevent dispersion of emitted electron beams, which are desired to be parallel, the electron beams are controlled using a magnet or a projection system, thereby achieving exact a one-to-one projection or a x-to-one projection of the desired pattern etched on the substrate.

9 Claims, 3 Drawing Sheets

APPARATUS FOR PYROELECTRIC EMISSION LITHOGRAPHY USING PATTERNED EMITTER

BACKGROUND OF THE INVENTION

1. Field of the Invention

The present invention relates to a method and apparatus for pyroelectric emission lithography using a patterned emitter.

2. Description of the Related Art

An apparatus for performing ferroelectric switching lithography, which uses a patterned emitter, emits electrons by switching a patterned ferroelectric emitter to expose an electron resist on a substrate to form a desired pattern which is the same as that of the emitter. Ferroelectric switching emission is disadvantageous in that the electrode formed on the emitter by a mask, absorbs electrons. Moreover, the emitter cannot reliably emit electrons when it is not connected to the electrode.

SUMMARY OF THE INVENTION

To solve the above problem, a feature of the present invention includes an apparatus for and method of pyroelectric lithography using a patterned emitter, in which a pyroelectric emitter or a ferroelectric emitter emits electrons when heated in a vacuum by infrared rays, a laser, or a heater. The emitter is patterned by a mask so that electrons emitted from the emitter expose an electron resist on a substrate to form a pattern which is the same as that of the emitter.

An apparatus for pyroelectric lithography according to the present invention comprises a plate type emitter formed of a pyroelectric material; a mask stacked on the plate type emitter in a desired pattern where the mask allows electrons to be emitted from the plate type emitter in a desired pattern; a substrate which carries an object to be etched to form the desired pattern; an electron resist deposited on the substrate where the electron resist is sensitive to the emitted electrons; a heating source for heating the plate type emitter; a power supply for applying a voltage between an emitter structure and the object to be etched to allow the electrons to be emitted from the emitter structure and applied to the object to be etched where the emitter structure comprises the plate type emitter and the mask, and the object to be etched comprises the substrate and the electron resist; and magnets disposed outside the emitter structure and the object to be etched for controlling the path of the electrons emitted from the emitter structure towards the object to be etched.

Preferably, the plate type emitter is formed of a ferroelectric material, the heating source is a remote controlled heater which generates infrared rays or a laser, or a contact heating plate which uses resistance heating. The heating source generates sufficient heat to heat the emitter to its Curie temperature.

There is also provided a method of providing a one-to-one projection of pyroelectric emission lithography comprising forming a plate type emitter of a pyroelectric material; masking the plate type emitter to form a desired pattern that allows electrons to be emitted in a desired pattern; depositing an electron resist on a substrate where the electron resist is sensitive to the emitted electrons; heating the plate type emitter; exposing the substrate to the emitter to form the desired pattern; applying a voltage between the emitter and the object to be etched to allow the electrons to be emitted along a path from the emitter and applied to the object to be etched; and controlling the path of electrons using magnets disposed outside the emitter structure and the object to be etched.

Further, there is also provided an apparatus for an x-to-one projection of pyroelectric emission, which comprises a plate type emitter formed of a pyroelectric material; a mask stacked on the plate type emitter in a desired pattern where the mask allows electrons to be emitted from the plate type emitter in a desired pattern; a substrate which carries an object to be etched to form the desired pattern; an electron resist deposited on the substrate where the electron resist induces the emitted electrons; a heating source for heating the plate type emitter; a power supply for applying a voltage between an emitter structure and an object to be etched to allow the electrons to be emitted from the emitter structure and applied to the object to be etched, the emitter structure comprising the plate type emitter and the mask, and the object to be etched comprising the substrate and the electron resist; and a projection system disposed between the emitter structure and the object to be etched for controlling the path of the electrons emitted from the emitter structure towards the object to be etched.

Preferably, the plate type emitter is formed of a ferroelectric material. The heating source is a remote controlled heater that generates infrared rays or a laser, or a contact heating plate which uses resistance heating. The heating source generates sufficient heat to heat the emitter to its Curie temperature. The projection system includes deflectors for deflecting electrons emitted from the emitter structure; a magnetic lens disposed between the deflectors where the magnetic lens focuses the emitted electrons; and an aperture for passing electrons focused by the magnetic lens and filtering out electrons drifting away from the focused electrons.

In addition, there is provided a method of providing an x-to-one projection of pyroelectric emission lithography comprising forming a plate type emitter of a pyroelectric material; masking the plate type emitter in a desired pattern to allow electrons to be emitted from the plate type emitter in a desired pattern; providing a substrate on which to etch a desired etching pattern; depositing an electron resist on the substrate; heating the plate type emitter; applying a voltage between the emitter and the object to be etched to allow the electrons to be emitted along a path from the emitter and the object to be etched; and controlling the path of electrons emitted from the emitter structure towards the object to be etched using a projection system.

The invention, though, is pointed out with particularity by the appended claims.

BRIEF DESCRIPTION OF THE DRAWINGS

The above features and advantages of the present invention will become is more apparent upon review of the illustrative embodiments thereof with reference to the accompanying drawings in which.

DESCRIPTION OF ILLUSTRATIVE EMBODIMENTS

In an apparatus for performing pyroelectric lithography using a patterned emitter according to the present invention, a pyroelectric emitter or a ferroelectric emitter is patterned using a mask and is then heated so that electrons are not emitted from that part of the emitter covered by the mask, but are emitted from the exposed part of the emitter not covered by the mask so that the shape of the emitter pattern is projected onto a substrate. Since electron beams emitted at this time may not be parallel to the path between the emitter and object, but instead may be dispersed, blurring of the image pattern of the emitter may occur. To reduce blurring, the electron beams are controlled using a magnet. The emitter is preferably heated to its Curie temperature Tc in order to provide a sufficient electron dose.

Figure 1:
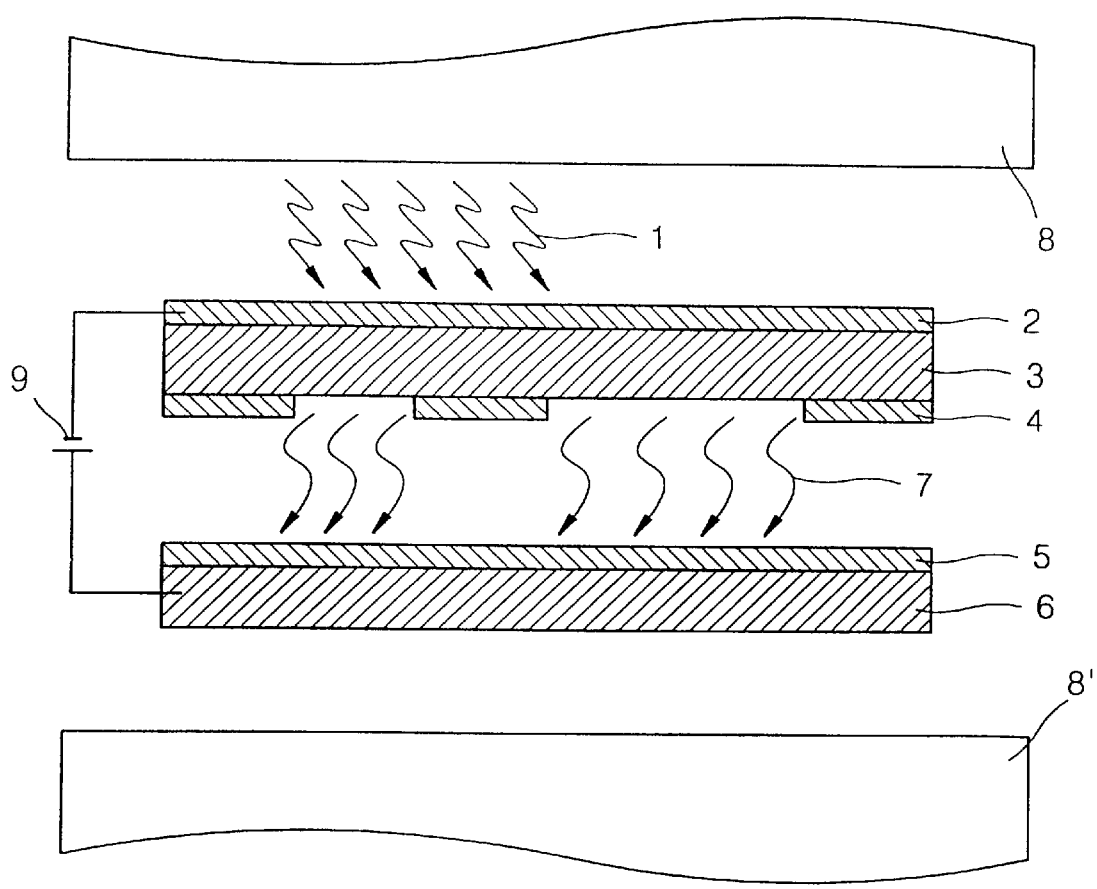
FIG. 1 is a schematic sectional view of an apparatus for pyroelectric emission lithography using a patterned emitter for achieving one-to-one projection of a pattern according to the present invention.

As described above, an apparatus for pyroelectric lithography according to the present invention heats a ferroelectric or pyroelectric emitter, as opposed to switching a ferroelectric emitter to emit electrons. As shown in FIG. 1, an emitter 3 formed of a pyroelectric or ferroelectric material emits electrons when it is heated in a vacuum by a heating source 1, such as infrared rays, laser or a heater. The emitter 3 is previously patterned so that electrons are not emitted from the part of the emitter screened by mask 4, but are emitted from the exposed part of the emitter not covered by the mask 4. Accordingly, the pattern of the emitter is projected on substrate 6. Since electron beams 7, may not be parallel but dispersed, blurring the imaged pattern may occur. To reduce blurring, the electron beams 7 are controlled using a magnet. Also, the emitter 3 is preferably heated to its Curie temperature Tc in order to provide sufficient electron dose.

In one-to-one projection system, an emitter structure which comprises the ferroelectric emitter 3 mounted on an emitter mount 2 and the mask 4, and an object to be etched in which the substrate 6 is coated with an electron resist 5, are disposed between permanent or direct current (DC) magnets 8 and 8'. Voltage source 9 is applied between the substrate 6 and the emitter 3 (voltage source 9 is applied to the emitter 3 through the emitter mount 2). To project electrons onto the substrate 6, the substrate 6 operates as an anode. The emitter 3 is heated remotely by the infrared rays or laser 1 or directly by a heating plate (which can be realized by the emitter mount 2) using electrical resistance heating, which comes in contact with the emitter 3. The heating plate, for example, may be coated with a tantalum (Ta) film.

Figure 2:
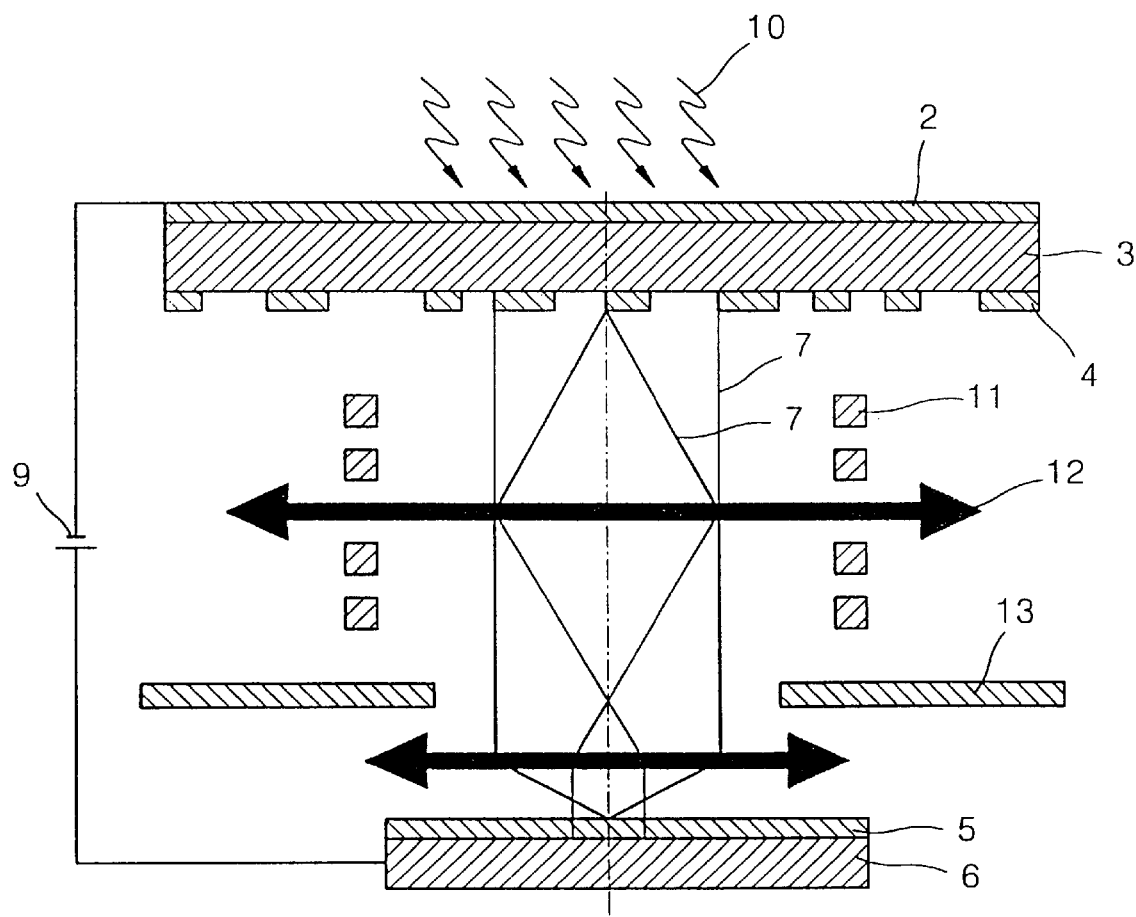
FIG. 2 is a schematic sectional view of an apparatus for pyroelectric emission lithography using a patterned emitter for x to one projection according to the present invention.

In an x-to-one projection system as depicted in FIG. 2, deflectors 11, a magnetic lens 12, and an aperture 13 are disposed in front of the emitter structure, which comprises the ferroelectric emitter 3 mounted on the emitter mount 2 and the mask 4, to refract electron beams and form a pattern having a reduced size on the substrate 6. The voltage source 9 is applied between the substrate 6 and the emitter mount 2.

The following description sets forth the principle of operation of pyroelectric emission lithography using the structure described above. When the emitter structure with the patterned mask 4 is heated in a vacuum, electron beams 7 are emitted from those parts of the emitter 3 which is not covered with the mask 4. At this time, the voltage source 9 is applied between the emitter 3 and the substrate 6, thereby forming an electric field. Then, the electron beams 7 are directed toward the substrate 6. The motion of electrons can be represented by a vector component which is parallel to the direction of the electric field and a vector component which is perpendicular (i.e., orthogonal) to the direction of the electric field.

As shown in FIG. 1, when an external magnetic field is applied parallel to the electric field, electrons within the electric field and the magnetic field move in a spiral direction. In other words, an electron motion vector parallel to the magnetic field results in electron motion parallel to the magnetic field, and an electron motion vector perpendicular to the electric field results in circular (harmonic) electron motion. The parallel motion and the circular motion, when combined, result in spiral motion 7. Accordingly, the spiral motion has a cycle. When the substrate 6 is separated from the emitter by a distance corresponding to a multiple of half or one wavelength of the cycle of the spiral motion, the pattern of the emitter 3 is exactly projected to the substrate 6 in a one-to-one ratio. This is the principle of one-to-one projection. Generally, an exact pattern is obtained by adjusting the voltage (electric field) and fixing the magnetic field and distance between the emitter and the substrate that carries the object to be etched.

A method of providing a one-to-one projection of pyroelectric emission lithography comprises providing a one-to-one projection of pyroelectric emission lithography, forming a plate type emitter of a pyroelectric material; masking the plate type emitter to form a desired pattern that allows electrons to be emitted in a desired pattern; depositing an electron resist on a substrate where the electron resist is sensitive to the emitted electrons; heating the plate type emitter; exposing the substrate to the emitter to form the desired pattern; applying a voltage between the emitter and the object to be etched to allow the electrons to be emitted along a path from the emitter to the object to be etched; and controlling the path of electrons using magnets disposed outside the emitter structure and the object to be etched. The method may further include forming the plate type emitter of a ferroelectric material. The heating step may include heating the emitter by at least one of infrared rays, laser, and an electrical resistance heater. The heating step may also include heating the emitter to a Curie temperature.

As shown in FIG. 2, in an x-to-one projection, the deflectors 11 and the magnetic lens 12 are disposed in front of the emitter structure to focus dispersed electron beams and to reduce the size of the emitter pattern. The aperture 13 is employed for clearly projecting the emitter pattern to the substrate 6. Because a small area rather than a large area is generally needed in order to reduce the size of the image of the emitter pattern formed on the substrate, the emitter structure is partially heated. Alternatively, the entire emitter pattern is projected onto the substrate 6 while the size of the image of the emitter pattern is reduced even when the entire emitter structure is heated.

Figure 3:
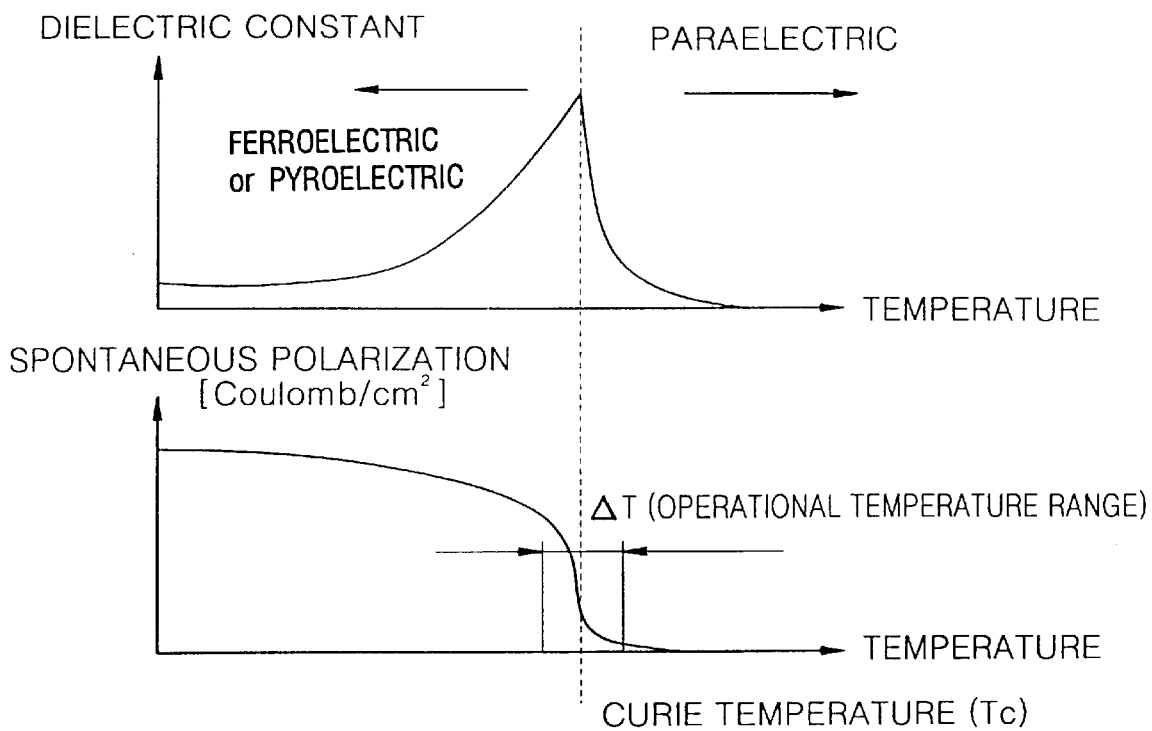
FIG. 3 is a graph showing typical phase transformation of a pyroelectric material and a ferroelectric material about at Curie temperature.

The emitter structure is preferably heated to its Curie temperature Tc to obtain a sufficient electron dose. To repeat the projection, heating and cooling are repeated. In this case, to achieve high production throughput, the emitter structure is preferably cooled to a temperature slightly below the Curie temperature Tc and heated to a temperature slightly above the Curie temperature Tc, as shown in FIG. 3. This is because the amount of electrons emitted from an emitter is proportional to the rate of spontaneous polarization, which varies between the lowest operational temperature to the Curie temperature. For the lowest operational temperature, room temperature may be considered as the limit. This however, is not necessary because phase transformation may be completed at a substantially higher temperature than the Curie temperature.

A method of providing an x-to-one projection of pyroelectric emission lithography, comprises forming a plate type emitter of a pyroelectric material; masking the plate type emitter in a desired pattern to allow electrons to be emitted from the plate type emitter in a desired pattern; providing a substrate on which to etch a desired etching pattern; depositing an electron resist on the substrate; heating the plate type emitter; applying a voltage between the emitter and the object to be etched to allow the electrons to be emitted along a path from the emitter and the object to be etched; and controlling the path of electrons emitted from the emitter structure towards the object to be etched using a projection system. In addition, the foregoing method may include forming the plate type emitter of a ferroelectric material. The heating step may include heating the emitter by at least one of infrared rays, laser, and an electrical resistance heater. In addition, heating may include heating the emitter to a Curie temperature. The controlling step may include deflecting emitted electrons from the emitter, focusing the emitted electrons using a magnetic lens, and after the focusing step, passing the emitted electrons through an aperture to filter out electrons drifting away from a focal path of electrons.

As described above, in an apparatus or method for implementing pyroelectric lithography using a patterned emitter, a pyroelectric emitter or a ferroelectric emitter is patterned using a mask. Upon heating the emitter, electrons are not emitted from that part of the emitter covered by the mask, but are emitted from the exposed part of the emitter that is not covered by the mask so that the shape of the emitter pattern is projected onto a substrate which carries the object to be etched. To prevent dispersion of emitted electron beams, which are desired to be parallel to the path between the emitter and the object being etched, the electron beams may be controlled using a magnet or projection system, thereby achieving a one-to-one or an x-to-one projection.

EXAMPLE:

30 μm width pattern was obtained under DC magnetic field of 0.27 Tesla, 4 kV DC bias at distance of 2.5 mm. BaTiO$_3$ emitter was heated by n+Si heating pad by applying DC current through n+Si pad. 4 kV was applied between collector (electron resist) and the heating pad. Emitter, collector heating pad and the thermocouple were put inside a vacuum tube for test and the vacuum level was maintained lower than $2 \times 10^{31\ 5}$ torr. An electromagnet was set up out side the vacuum tube to get DC magnetic field.

While the above embodiments are illustrative, it will become apparent from the teachings herein that alternative embodiments may be constructed without departing from the spirit of the invention. Accordingly, it is the intent to embrace all such embodiments as may come to those skilled in the art to which the subject matter of the present invention pertains.

What is claimed is:

1. An apparatus for providing a one-to-one projection of pyroelectric emission lithography, comprising:
    a plate type emitter formed of a pyroelectric material;
    a mask stacked on the plate type emitter in a desired pattern, the mask allowing electrons to be emitted from the plate type emitter in a desired pattern;
    a substrate which carries an object to be etched to form the desired pattern;
    an electron resist deposited on the substrate, the electron resist being sensitive to the emitted electrons;
    a heating source for heating the plate type emitter;
    a power supply for applying a voltage between an emitter structure and the object to be etched to allow the electrons to be emitted from the emitter structure and applied to the object to be etched, the emitter structure comprising the plate type emitter and the mask, and the object to be etched comprising the substrate and the electron resist; and
    magnets disposed outside the emitter structure and the object to be etched, the magnets controlling the path of the electrons emitted from the emitter structure towards the object to be etched.

2. The apparatus of claim 1, wherein the plate type emitter is formed of a ferroelectric material.

3. The apparatus of claim 1, wherein the heating source is a remote controlled heater which generates infrared rays or laser, or a contact heating plate which uses electrical resistance heating.

4. The apparatus of claim 1, wherein the heating source is formed to performs heating of the emitter to a Curie temperature.

5. An apparatus for an x-to-one projection of pyroelectric emission lithography, comprising:
    a plate type emitter formed of a pyroelectric material;
    a mask stacked on the plate type emitter in a desired pattern, the mask allowing electrons to be emitted from the plate type emitter in a desired pattern;
    a substrate which carries an object to be etched to form the desired pattern;
    an electron resist deposited on the substrate, the electron resist inducing the emitted electrons;
    a heating source for heating the plate type emitter;
    a power supply for applying a voltage between an emitter structure and an object to be etched to allow the electrons to be emitted from the emitter structure and applied to the object to be etched, the emitter structure comprising the plate type emitter and the mask, and the object to be etched comprising the substrate and the electron resist; and
    a projection system disposed between the emitter structure and the object to be etched for controlling the path of the electrons emitted from the emitter structure towards the object to be etched.

6. The apparatus of claim 5, wherein the plate type emitter is formed of a ferroelectric material.

7. The apparatus of claim 5, wherein the heating source is a remote controlled heater that generates infrared rays or laser, or a contact heating plate which uses electrical resistance heating.

8. The apparatus of claim 5, wherein the heating source heats the emitter to a Curie temperature.

9. The apparatus of claim 5, wherein the projection system comprises:
    deflectors for deflecting electrons emitted from the emitter structure;
    a magnetic lens disposed between the deflectors, the magnetic lens focusing the emitted electrons; and
    an aperture for passing electrons focused by the magnetic lens and filtering out electrons drifting away from the focused electrons.

* * * * *